(12) United States Patent
Kim et al.

(10) Patent No.: US 11,450,716 B2
(45) Date of Patent: Sep. 20, 2022

(54) ELECTROLUMINESCENCE DISPLAY HAVING MICRO-LENS LAYER

(71) Applicant: LG Display Co., Ltd., Seoul (KR)

(72) Inventors: DaeYong Kim, Paju-si (KR); SeMin Lee, Paju-si (KR); Eunhee Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 196 days.

(21) Appl. No.: 16/892,785

(22) Filed: Jun. 4, 2020

(65) Prior Publication Data

US 2020/0403038 A1 Dec. 24, 2020

(30) Foreign Application Priority Data

Jun. 21, 2019 (KR) ........................ 10-2019-0074045

(51) Int. Cl.
*H01L 27/32* (2006.01)
*H01L 51/52* (2006.01)

(52) U.S. Cl.
CPC ........ *H01L 27/322* (2013.01); *H01L 51/5246* (2013.01); *H01L 51/5275* (2013.01); *H01L 51/5284* (2013.01)

(58) Field of Classification Search
None
See application file for complete search history.

(56) References Cited

U.S. PATENT DOCUMENTS

| | | | |
|---|---|---|---|
| 2008/0192484 A1* | 8/2008 | Lee | ........................ F21V 13/04 362/327 |
| 2014/0353626 A1* | 12/2014 | Shim | ................... H01L 51/5265 359/601 |
| 2018/0284534 A1* | 10/2018 | Song | ................. G02F 1/133512 |
| 2020/0058905 A1* | 2/2020 | Kyoung | .............. H01L 51/5056 |
| 2021/0057678 A1* | 2/2021 | Motoyama | .......... H01L 27/3258 |
| 2021/0376286 A1* | 12/2021 | Fujimaki | ............. H01L 51/5246 |

* cited by examiner

*Primary Examiner* — Nduka E Ojeh
(74) *Attorney, Agent, or Firm* — Morgan, Lewis & Bockius LLP

(57) ABSTRACT

The present disclosure relates to an electroluminescence display having micro-lens layer. The electroluminescence display according to the present disclosure comprises: a lower substrate having a light emitting layer at middle portions; an upper substrate facing the upper substrate; a dam disposed at circumferences of the lower substrate and surrounding the light emitting layer; a filling layer filling space surrounded by the dam and covering the light emitting layer; a micro-lens layer disposed on the inner surface of the upper substrate; a color filter disposed as corresponding to the light emitting layer under the micro-lens layer; and a black matrix disposed at a side of the color filters under the micro-lens layer.

12 Claims, 5 Drawing Sheets

ELECTROLUMINESCENCE DISPLAY HAVING MICRO-LENS LAYER

CROSS-REFERENCE TO RELATED APPLICATIONS

This application claims the benefit of the Korean Patent Application No. 10-2019-0074045 filed on Jun. 21, 2019, which is hereby incorporated by reference as if fully set forth herein.

BACKGROUND

Technical Field

The present disclosure relates to an electroluminescence display having micro-lens layer, and more particularly, to an electroluminescence display having micro-lens layer for enhancing the brightness on the front direction by reacting selectively to a specific wavelength.

Discussion of the Related Art

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

In particular, the electroluminescent display which is a self-luminous display, has an excellent optical performance such as a viewing angle and color realization degree, so that its application field is gradually widening and is receiving attention as an image display device. However, due to the characteristics of the organic light emitting display, when the front luminance for light for a specific wavelength is largely different from light of other wavelengths, there may be a case where the realized color gamut may not be properly represented. Therefore, there is a need for a structural complementary feature ensuring a constant front luminance regardless of wavelengths.

In addition, it is necessary to develop an electroluminescent display having a long service life and high reliability by preventing foreign materials such as mouistur and gas from penetrating into the display while improving the optical properties.

SUMMARY

Accordingly, embodiments of the present disclosure are directed to an electroluminescent display that substantially obviates one or more of the problems due to limitations and disadvantages of the related art.

An aspect of the present to provide an electroluminescence display having micro-lens layer. Another aspect of the present disclosure is to provide an electroluminescence display having micro-lens layer in which the micro-lens layer is disposed between the upper substrating and a color filter layer to reduce the gap between the color filter and the organic light emitting diode for ensuring superior viewing angle property. Still another aspect of the present disclosure is to provide an electroluminescence display having enhanced front brightness of light for a specific wavelength, by adjusting the lens size and interval of the lens patterns of the micro-lens layer so that light of a specific wavelength passing through the color filter selectively reacts to the micro-lens.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electroluminescence display comprises: a lower substrate having a light emitting layer at middle portions; an upper substrate facing the upper substrate; a dam disposed at circumferences of the lower substrate and surrounding the light emitting layer; a filling layer filling space surrounded by the dam and covering the light emitting layer; a micro-lens layer disposed on the inner surface of the upper substrate; a color filter disposed as corresponding to the light emitting layer under the micro-lens layer; and a black matrix disposed at a side of the color filters under the micro-lens layer.

In one embodiment, the color filter includes a plurality of color filters having different color, respectively.

In one embodiment, the micro-lens layer is disposed on the plurality of color filters, a width of a lens pattern is any one in rage of 430 nm to 490 nm, and a pitch of the lens pattern is any one in range of 410 nm to 510 nm.

In one embodiment, the micro-lens layer includes: a first micro lens pattern corresponding to a first color filter; a second micro lens pattern corresponding to a second color filter; and a third micro lens pattern corresponding to a third color filter.

In one embodiment, the first color filter passes a light in a wavelength of 630 nm, a width of the first micro lens pattern is any one in rage of 600 nm to 660 nm, and a pitch of the first micro lens pattern is any one in range of 580 nm to 680 nm.

In one embodiment, the second color filter passes a light in a wavelength of 530 nm, a width of the second micro lens pattern is any one in rage of 500 nm to 560 nm, and a pitch of the second micro lens pattern is any one in range of 480 nm to 580 nm.

In one embodiment, the third color filter passes a light in a wavelength of 460 nm, a width of the third micro lens pattern is any one in rage of 430 nm to 490 nm, and a pitch of the third micro lens pattern is any one in range of 410 nm to 510 nm.

In one embodiment, the micro-lens layer has a thickness in range of 25 μm to 50 μm.

In one embodiment, the micro-lens layer has a refractive index in range of 1.4 to 1.7.

In one embodiment, the dam attaches the upper substrate and the lower substrate by adhering inner circumference surfaces of the upper substrate and the lower substrate.

In one embodiment, the micro-lens layer includes: a pattern portion contacting the color filter and the black matrix and having a plurality of lens patterns; and an encapsulation portion expanding from the pattern portion to the outside, covering upper surface and the outer side surface of the dam, covering a side surface of the lower substrate and covering an outer bottom surface of the lower substrate.

In one embodiment, the display further includes an adhesive layer disposed between the encapsulating layer and the outer side surface of the dam, between the encapsulationg layer and the side surface of the lower substrate, and between the encapsulating layer and the outer bottom surface of the lower substrate.

In one embodiment, the micro-lens layer has a plurality of micro lens pattern within areas surrounded by the dam.

The electroluminescent display according to the present disclosure includes a micro-lens layer between the upper substrate and the color filter. Accordingly, the distance from the organic light emitting diode and the color filter is getting narrow as the thickness of the micro-lens layer, so that the optical property such as viewing angle may be enhanced. By adjusting the lens size and the array pattern suitable for reacting to light of a specific wavelength passing through the color filter, the front brightness of light of the specific wavelength may be selectively enhanced. Further, additional encapsulation layer surrounding the display panel using the micro-lens layer, the foreign materials such as moisture or gas may be prevented from intruding into the display. Accordingly, the electroluminescence display according to the present disclosure may have long life time and excellent reliability.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE DISCLOSURE

Figure 1:
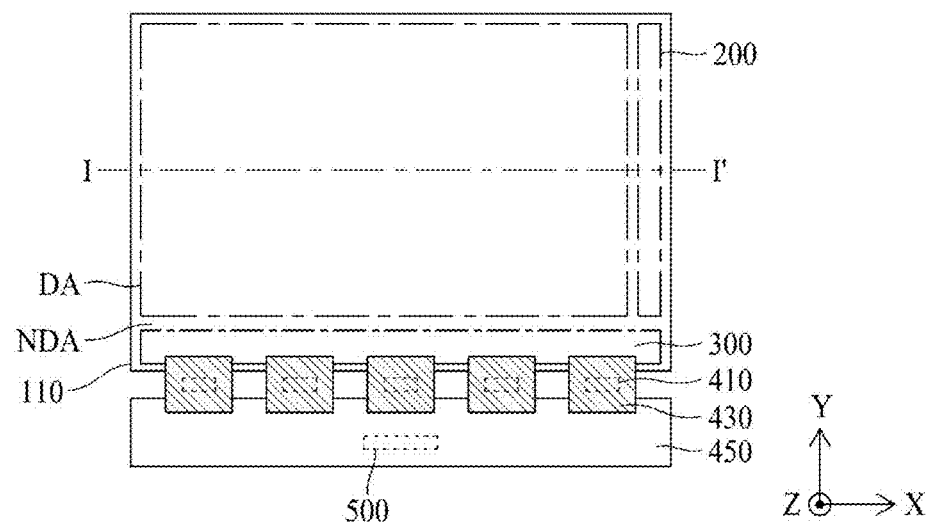
FIG. 1 is a diagram illustrating a schematic structure of an electroluminescence display according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as the first, the second, A, B, (a) and (b) may be used. These terms are only to distinguish the elements from other elements, and the terms are not limited in nature, order, sequence or number of the elements. When an element is described as being "linked", "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings. Scale of the elements shown in the accompanying drawings have a different scale from the actual for convenience of description, it is not limited to the scale shown in the drawings.

Hereinafter, referring to figures, we will explain about the present disclosure in detail. FIG. 1 is a diagram illustrating a schematic structure of an electroluminescence display according to the present disclosure. In FIG. 1, X-axis may be parallel to the extending direction of the scan line, Y-axis may be parallel to the extending direction of the data line, and Z-axis may represent the thickness direction of the display.

Referring to FIG. 1, the electroluminescence display comprises a substrate 110, a gate (or scan) driver 200, a data pad portion 300, a source driving IC (Integrated Circuit) 410, a flexible film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area DA and a non-display area NDA. The display area DA, which is an area for representing the video images, may be defined as the majority middle area of the substrate 110, but it is not limited thereto. In the display area DA, a plurality of scan lines (or gate lines), a plurality of data lines and a plurality of pixels may be formed or disposed. Each of pixels may include a plurality of sub pixies. Each of sub pixies includes the scan line and the data line, respectively.

The non-display area NDA, which is an area not representing the video images, may be defined at the circumference areas of the substrate 110 surrounding all or some of the display area DA. In the non-display area NDA, the gate driver 200 and the data pad portion 300 may be formed or disposed.

The gate driver 200 may supply the scan (or gate) signals to the scan lines according to the gate control signal received from the timing controller 500. The gate driver 200 may be formed at the non-display area NDA at any one outside of the display area DA on the substrate 110, as a GIP (Gate driver In Panel) type. GIP type means that the gate driver 200 is directly formed on the substrate 110.

The data pad portion 300 may supply the data signals to the data line according to the data control signal received from the timing controller 500. The data pad portion 300 may be made as a driver chip and mounted on the flexible film 430. Further, the flexible film 430 may be attached at the non-display area NDA at any one outside of the display area DA on the substrate 110, as a TAB (Tape Automated Bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (Chip On Film) or COP (Chip On Plastic) type.

The flexible film 430 may include a plurality of first link lines connecting the data pad portion 300 to the source driving IC 410, and a plurality of second link lines connecting the data pad portion 300 to the circuit board 450. The flexible film 430 may be attached on the data pad portion 300 using an anisotropic conducting film, so that the data pad portion 300 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from a external system board through the line cables of the circuit board 450. The timing controller 500 may generate a gate control signal for controlling the operation timing of the gate driver 200 and a source control signal for controlling the source driving IC 410, based on the timing signal. The timing controller 500 may supply the gate control signal to the gate driver 200 and supply the source control signal to the source driving IC 410. Depending on the product types, the timing controller 500 may be formed as one chip with the source driving IC 410 and mounted on the substrate 110.

Figure 2:
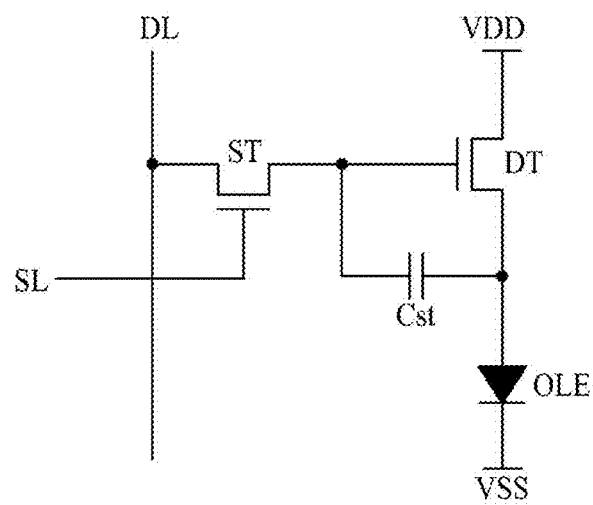
FIG. 2 is a circuit diagram illustrating a structure of one pixel according to the present disclosure.
Figure 3:
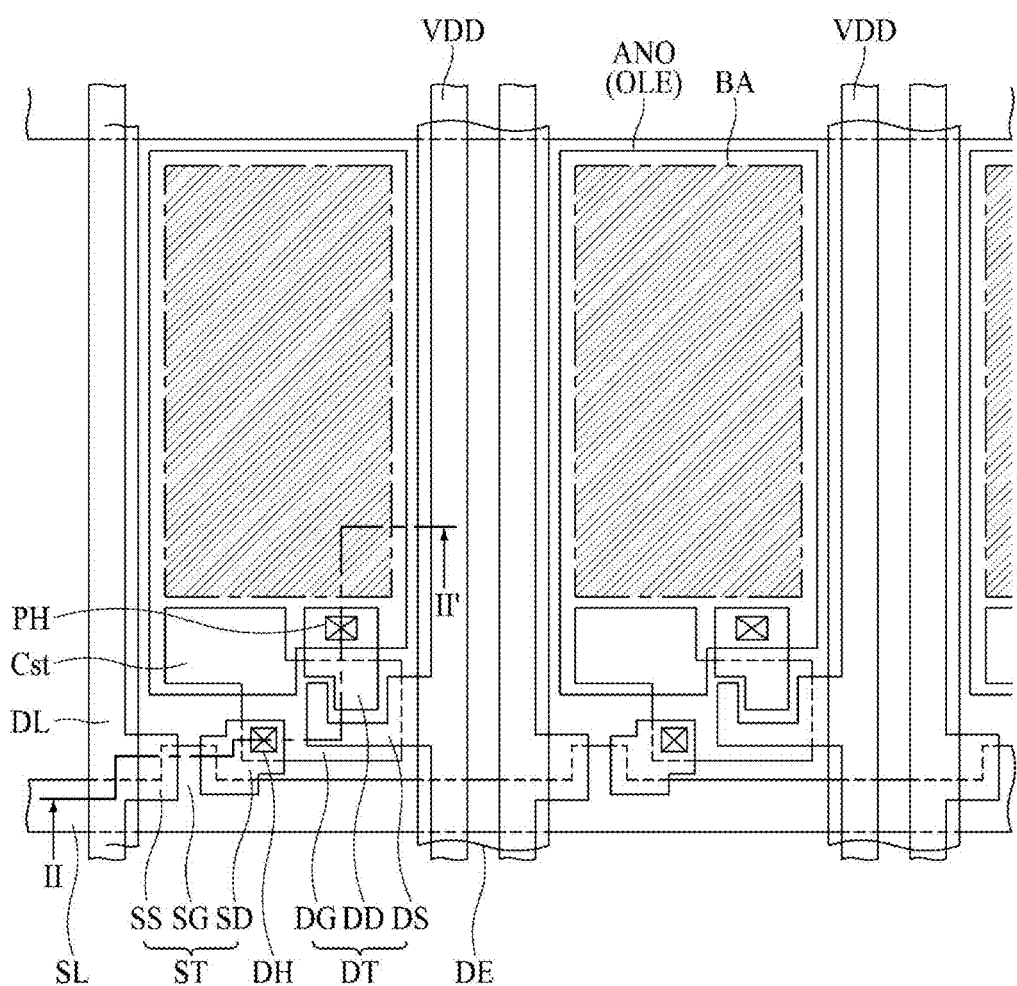
FIG. 3 is a plan view illustrating a structure of the pixels according to the present disclosure.
Figure 4:
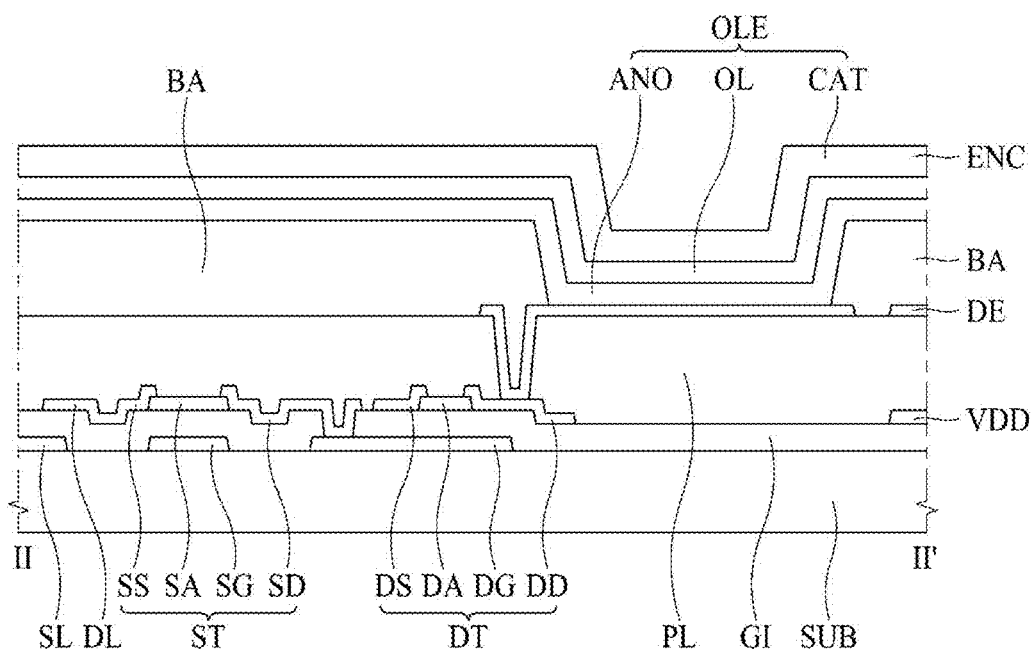
FIG. 4 is a cross-sectional view along to cutting line II-IF in FIG. 3, for illustrating the structure of the electroluminescent display according to the present disclosure.

FIG. 2 is a circuit diagram illustrating a structure of one pixel according to the present disclosure. FIG. 3 is a plan view illustrating a structure of the pixels according to the present disclosure. FIG. 4 is a cross-sectional view along to cutting line II-IF in FIG. 3, for illustrating the structure of the electroluminescent display according to the present disclosure. Referring FIGS. 2 to 4, we will explain the example of the present disclosure using an organic light emitting display, one embodiment of the luminescence display apparatus.

Referring to FIGS. 2 to 4, one pixel of the organic light emitting display may be defined by a scan line SL, a data line DL and a driving current line VDD. One pixel of the organic light emitting display may include a switching thin film transistor ST, a driving thin film transistor DT, an organic light emitting diode OLE and a storage capacitance Cst. The driving current line VDD may be supplied with a high level voltage for driving the organic light emitting diode OLE.

For example, the switching thin film transistor ST may be disposed at the portion where the scan line SL and the data line DL is crossing. The switching thin film transistor ST may include a switching gate electrode SG, a switching source electrode SS and a switching drain electrode SD. The switching gate electrode SG may be connected to the scan line SL. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the organic light diode OLED of the selected pixel by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. The driving source electrode DS may be connected to the driving current line VSS, and the driving drain electrode DD may be connected to an anode electrode ANO of the organic light emitting diode OLE. A storage capacitance Cst may be disposed between the driving gate electrode DG o the driving thin film transistor DT and the anode electrode ANO of the organic light emitting diode OLE.

The driving thin film transistor DT may be disposed between the driving current line VDD and the organic light emitting diode OLE. The driving thin film transistor DT may control the amount of electric currents flowing to the organic light emitting diode OLE form the driving current line VDD according to the voltage level of the driving gate electrode DG connected to the switching drain electrode SD of the switching thin film transistor ST.

The organic light emitting diode OLE may include an anode electrode ANO, an organic emitting layer EL and a cathode electrode CAT. The organic light emitting diode OLE may emit the light according to the amount of the electric current controlled by the driving thin film transistor DT. In other word, the organic light emitting diode OLE may be driven by the voltage differences between the low level voltage and the high level voltage controlled by driving thin film transistor DT.

Hereinafter, referring to figures, we will explain about various embodiments of the electroluminescence display according to the present disclosure.

First Embodiment

Figure 5:
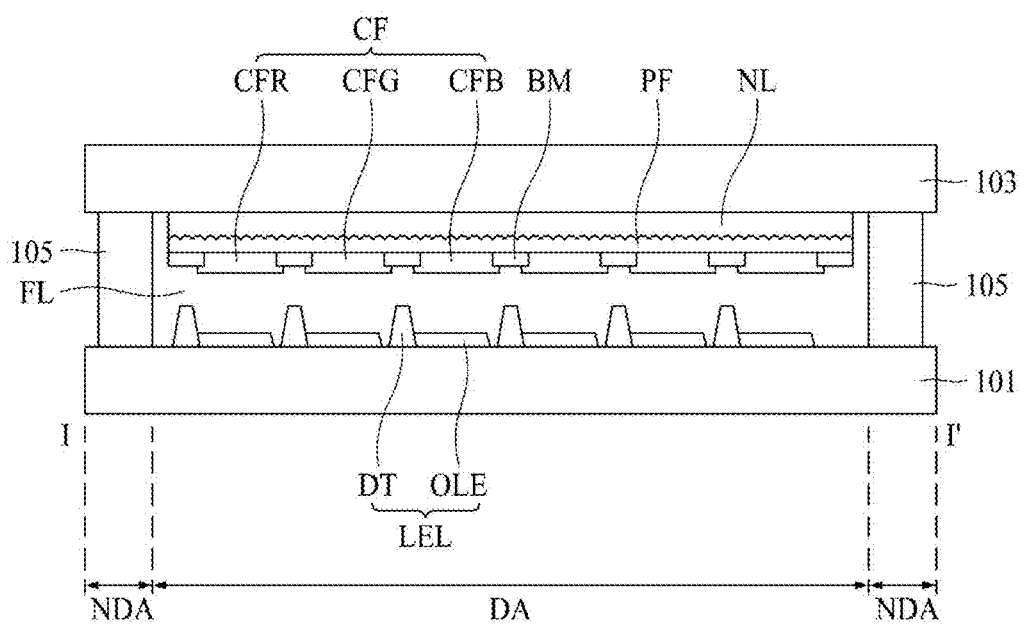
FIG. 5 is a cross-sectional view along to cutting line I-I' in FIG. 1, for illustrating a structure of the electroluminescent display according to the first embodiment of the present disclosure.

Referring to FIG. 5, we will explain about the first embodiment of the present disclosure. FIG. 5 is a cross-sectional view along to cutting line I-I' in FIG. 1, for illustrating a structure of the electroluminescent display according to the first embodiment of the present disclosure.

Referring to FIG. 5, the electroluminescence display according to the first embodiment of the present disclosure comprises a lower substrate 101, an upper substrate 103, a dam 105, a filling layer FL, a micro-lens layer NL, a color filter CF, a black matrix BM and a display layer LEL. The lower substrate 101 and the upper substrate 103 may be joined each other with a predetermined uniform gap. The lower substrate 101 and the upper substrate 103 may correspond to the substrate 110 as explained in FIG. 1. Therefore, the lower substrate 101 and the upper substrate 103 may include a display area DA and a non-display area NDA.

The light emitting layer LEL may be formed on the inner surface of the lower substrate 101. Especially, the light emitting layer LEL may be disposed on the display area DA of the lower substrate 101. The light emitting layer LEL may include the thin film transistors ST and DT and the organic light emitting diode OLE as explained in FIG. 1. In FIG. 5, these elements are illustrated as the light emitting layer LEL in convenience.

The micro-lens layer NL may be disposed on the inner surface of the upper substrate 103. On the micro-lens layer NL, the black matrix BM and the color filter CF may be formed. The micro-lens layer NL, the color filter CF and the black matrix BM are disposed on the display area DA of the upper substrate 103. The color filter CF may be at the area corresponding to the organic light emitting diode OLE. The black matrix BM may be disposed at the area corresponding to the thin film transistors ST and DT. As the top surface of the micro-lens layer NM may be not smooth, a planarization layer PF may be further disposed over the micro-lens layer NL and under the color filter CF and the black matrix BM.

The lower substrate 101 and the upper substrate 103 may be joined each other with a uniform gap having a dam 105 there-between. Further, between the lower substrate 101 and the upper substrate 103, the filling layer FL may be disposed to maintain the uniform gap. The dam 105 may directly contact to the inner surface of the non-display area NDA of the lower substrate 101, and the inner surface of the non-display area NDA of the upper substrate 103. That is, the dam 105 may be disposed at the non-display area NDA as surrounding the light emitting layer LEL formed at the display area DA. The filling layer FL may fill the inner space surrounded by dam 105 and cover the light emitting layer LEL.

The color filter CF may include a red color filter CFR, a green color filter CFG and a blue color filter CFB. The red color filter CFR, the green color filter CFG and the blue color filter CFB are alternately disposed each other in a direction on a plan surface. A unit pixel may be configured with the red color filter CFR, the green color filter CFG and the blue color filter CFB.

In another example, even though not shown in figure, the color filter CF may further include a white color filter adding to the red color filter CFR, the green color filter CFG and the blue color filter CFB. Otherwise, a transparent area having no color filter may be further included in the unit pixel.

The micro-lens layer NL may be formed of a transparent resin material. For example, the micro-lens layer NL may include a transparent resin material having a refractive index in a range of 1.4~1.7. In detail, the micro-lens layer NL may be formed by depositing a transparent resin material such as the colorless polyimide (CPI) and the poly aluminium chloride (PAC), hardening and patterning it to form a plurality of convex lens patterns arrayed as a plan sheet. The micro-lens layer NL may have a thickness in a range of 25 μm~50 μm.

For the micro-lens layer NL according to the first embodiment, the width (or diameter) of lens may be any one in a range of 430 nm to 490 nm. The arrayed interval (or pitch) of the micro-lens pattern may be any one in a range of 410 nm to 510 nm. For this case of micro-lens pattern, only the path of the light in the blue wavelength band (460±50 nm) may be changed into perpendicular direction to the plan surface of the micro-lens layer NL.

In detail, when light in the red or green wavelength bands enters into the micro-lens layer NL having above mentioned size and pitch, the light incident to the perpendicular direction goes to the perpendicular direction, and the light incident into a slanted direction to the perpendicular direction goes to the slanted direction. However, when light in the blue wavelength bands enters into the micro-lens layer NL, the light incident to the perpendicular direction passes the micro-lens layer NL to the perpendicular direction, but the light incident into a slanted direction to the perpendicular direction may be refracted to the perpendicular direction. So that most of all lights may be concentrated to the perpendicular direction and passes through the micro-lens layer NL. As the micro-lens layer NL has a refractive index higher than other layers, and has a characterisitics for reacting selectively to the blue light wavelength band, this micro-lens layer NL may enhance the front brightness (or front luminance) of the blue light, selectively.

In the first embodiment, the micro-lens layer NL may be disposed between the color filter CF and the upper substrate 103. In the case that the micro-lens layer NL is disposed between the color filter CF and the filling layer FL, the distance between the color filter CF and the organic light emitting diode OLE is getting far as the thickness of the micro-lens layer NL, so that the viewing angle is getting narrower. However, as for the first embodiment, the distance between the organic light emitting layer OLE and the color filter CF is not affected by the thickness of the micro-lens layer NL, so that the viewing angle is not narrowed and then the optical property may be maintained in the superior condition.

In addition, as the inside wall surface of the dam 105 contacts the micro-lens layer NL, the intrusion of the foreign materials such as moisture and gas may be effectively prevented into the display elements. The dam 105 may have a height corresponding to the sum of the thicknesses of the filling layer FL and the thickness of the micro-lens layer NL. As the result, the dam 105 according to the first embodiment is higher than that in the case of without micro-lens layer NL, so that the foreign materials may be effectively prevented. Therefore, the electroluminescence according to the first embodiment has the longer life service time and the improved reliability.

Second Embodiment

Figure 6:
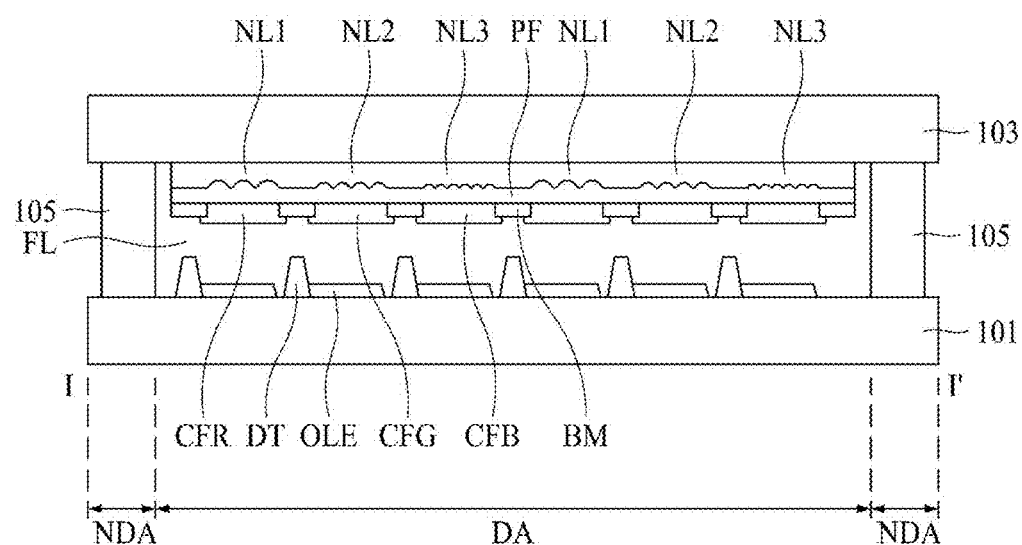
FIG. 6 is a cross-sectional view along to cutting line I-I' in FIG. 1, for illustrating a structure of the electroluminescent display according to the second embodiment of the present disclosure.

Hereinafter, referring to FIG. 6, we will explain about the second embodiment of the present disclosure. FIG. 6 is a cross-sectional view along to cutting line I-I' in FIG. 1, for illustrating a structure of the electroluminescent display according to the second embodiment of the present disclosure.

Referring to FIG. 6, the electroluminescence display according to the first embodiment of the present disclosure comprises a lower substrate 101, an upper substrate 103, a dam 105, a filling layer FL, a micro-lens layer NL, a color filter CF, a black matrix BM and a display layer LEL. The lower substrate 101 and the upper substrate 103 may be joined each other with a predetermined uniform gap. The lower substrate 101 and the upper substrate 103 may include a display area DA and a non-display area NDA.

The light emitting layer LEL may be formed on the inner surface of the lower substrate 101. Especially, the light emitting layer LEL may be disposed on the display area DA of the lower substrate 101. The light emitting layer LEL may include the thin film transistors ST and DT and the organic light emitting diode OLE as explained in FIG. 1. In FIG. 6, these elements are illustrated as the light emitting layer LEL in convenience.

The micro-lens layer NL may be disposed on the inner surface of the upper substrate 103. On the micro-lens layer NL, the black matrix BM and the color filter CF may be formed. The micro-lens layer NL, the color filter CF and the black matrix BM are disposed on the display area DA of the upper substrate 103. The color filter CF may be at the area corresponding to the organic light emitting diode OLE. The black matrix BM may be disposed at the area corresponding to the thin film transistors ST and DT. As the top surface of the micro-lens layer NM may be not smooth, a planarization layer PF may be further disposed over the micro-lens layer NL and under the color filter CF and the black matrix BM.

The lower substrate 101 and the upper substrate 103 may be joined each other with a uniform gap having a dam 105 there-between. Further, between the lower substrate 101 and the upper substrate 103, the filling layer FL may be disposed to maintain the uniform gap. The dam 105 may be directly contact to the inner surface of the non-display area NDA of the lower substrate 101, and the inner surface of the non-display area NDA of the upper substrate 103. That is, the dam 105 may be disposed at the non-display area NDA as surrounding the light emitting layer LEL formed at the display area DA. The filling layer FL may fill the inner space surrounded by dam 105 and cover the light emitting layer LEL.

The color filter CF may include a red color filter CFR, a green color filter CFG and a blue color filter CFB. The red color filter CFR, the green color filter CFG and the blue color filter CFB are alternately disposed each other in a direction on a plan surface. A unit pixel may be configured with the red color filter CFR, the green color filter CFG and the blue color filter CFB.

In another example, even though not shown in figure, the color filter CF may further include a white color filter adding to the red color filter CFR, the green color filter CFG and the blue color filter CFB. Otherwise, a transparent area having no color filter may be further included in the unit pixel.

The micro-lens layer NL may be formed of a transparent resin material. For example, the micro-lens layer NL may be formed by depositing a transparent resin material such as the colorless polyimide (CPI) and the poly aluminium chloride (PAC), hardening and patterning it to form a plurality of convex lens patterns arrayed as a plan sheet. The micro-lens layer NL may have a thickness in a range of 25 μm~50 μm.

For the electroluminescence display according to the second embodiment, the micro-lens layer NL may include a first micro-lens pattern NL1, a second micro lens pattern NL2 and a third micro lens pattern NL3. The first micro lens pattern NL1 may be disposed as corresponding to the red color filter CFR, the second micro lens pattern NL2 may be disposed as corresponding to the green color filter CFG and the third micro lens pattern NL3 may be disposed as corresponding to the blue color filter CFB.

In this case, it is preferable that the first micro lens pattern NL1, the second micro lens pattern NL2 and the third micro lens pattern NL3 have the optimized lens sizes and the optimized lens pitches according to the light wavelength bands of each color filters, respectively. For example, the first micro lens pattern NL1 corresponding to the red color filter CFR may have a lens width (or diameter) in a range of 600 nm to 660 nm. The arrayed interval (or pitch) of the first micro lens pattern NL1 may be any one in a range of 580 nm to 680 nm. As considering that the wavelength band of the red light may be in the range of 630±50 nm, it is preferable that the width of the first micro lens pattern NL1 may be any one from 600 nm which is 30 nm shorter than 630 nm (representative wavelength of red light) to 660 nm which is 30 nm longer than 630 nm. In the interim, the pitch of the first micro lens pattern NL1 may be any one from 580 nm which is 50 nm shorter than 630 nm (representative wavelength of red light) to 680 nm which is 50 nm longer than 630 nm.

Likewise, the second micro lens pattern NL2 corresponding to the green color filter CFG may have a lens width (or diameter) in a range of 500 nm to 560 nm. The arrayed interval (or pitch) of the second micro lens pattern NL2 may be any one in a range of 480 nm to 580 nm. As considering that the wavelength band of the green light may be in the range of 530±50 nm, it is preferable that the width of the second micro lens pattern NL2 may be any one from −30 nm to +30 nm based on 530 nm (representative wavelength of green light). In the interim, the pitch of the second micro lens pattern NL2 may be any one from −50 nm to +50 nm based on 530 nm (representative wavelength of green light).

Further, the third micro lens pattern NL3 corresponding to the blue color filter CFB may have a lens width (or diameter) in a range of 430 nm to 490 nm. The arrayed interval (or pitch) of the third micro lens pattern NL3 may be any one in a range of 410 nm to 510 nm. As considering that the wavelength band of the blue light may be in the range of 460±50 nm, it is preferable that the width of the third micro lens pattern NL3 may be any one from −30 nm to +30 nm based on 460 nm (representative wavelength of blue light). In the interim, the pitch of the third micro lens pattern NL3 may be any one from −50 nm to +50 nm based on 530 nm (representative wavelength of blue light).

By forming the micro lens patterns selectively reacting to the light in the wavelength band radiated from the color filter CF, the front brightnesses (luminance) of the red, green and blue light wavelength bands can be enhanced, respectively.

Even though it is not shown in figures, in the case that one unit pixel further includes a sub pixel having a white color filter or in the case that one unit pixel further includes a transparent sub pixel without any color filter, the micro lens pattern for these sub pixels may be same as the micro lens pattern of neighboring sub pixel, because light in all wavelength bands may pass through the white color filter or the transparent sub pixel. For one example, the white sub pixel or the transparent sub pixel may have the micro lens pattern same as the third micro lens pattern NL3.

In the second embodiment, as in the first embodiment, the micro lens layer NL may be disposed between the color filter CF and the upper substrate 103. Accordingly, since the distance between the organic light emitting diode OLE and the color filter CF is narrower as the thickness of the micro lens layer NL, so that the optical property such as a viewing angle may not be degraded or be improved.

In addition, as the inside wall surface of the dam 105 contacts the micro-lens layer NL, the intrusion of the foreign materials such as moisture and gas may be effectively prevented into the display elements. The dam 105 may have a height corresponding to the sum of the thicknesses of the filling layer FL and the thickness of the micro-lens layer NL. As the result, the dam 105 according to the first embodiment is higher than that in the case of without micro-lens layer NL, so that the foreign materials may be effectively prevented. Therefore, the electroluminescence according to the second embodiment has the longer life service time and the improved reliability.

Third Embodiment

Figure 7:
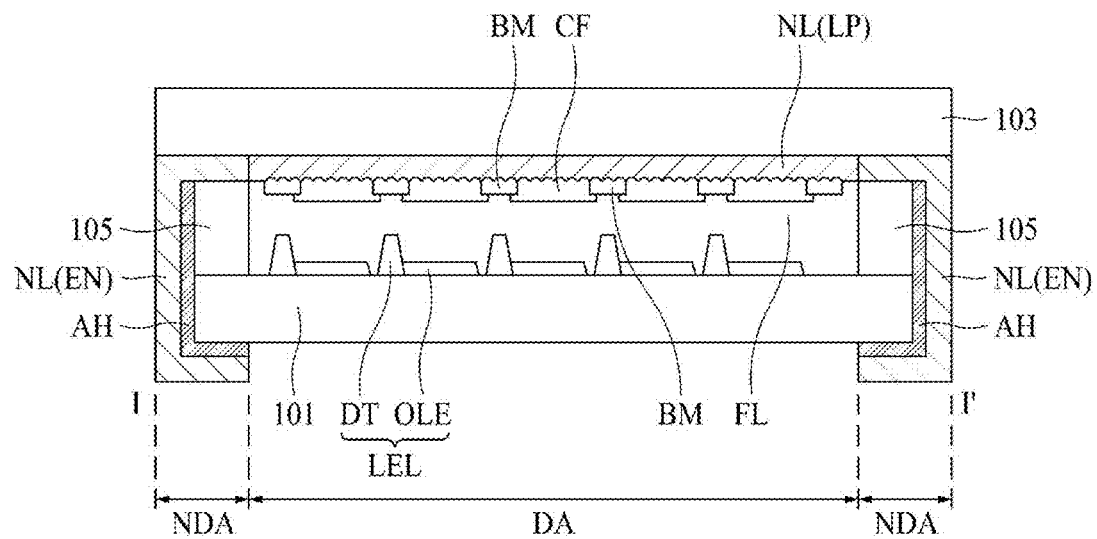
FIG. 7 is a cross-sectional view along to cutting line I-I' in FIG. 1, for illustrating a structure of the electroluminescent display according to the third embodiment of the present disclosure.

Hereinafter, referring to FIG. 6, we will explain about the second embodiment of the present disclosure. FIG. 7 is a cross-sectional view along to cutting line I-I' in FIG. 1, for illustrating a structure of the electroluminescent display according to the third embodiment of the present disclosure. Referring to FIG. 7, the electroluminescence display according to the third embodiment of the present disclosure comprises a lower substrate 101, an upper substrate 103, a dam 105, a filling layer FL, a micro-lens layer NL, a color filter CF, a black matrix BM and a display layer LEL. The lower substrate 101 and the upper substrate 103 may be joined each other with a predetermined uniform gap. The lower substrate 101 and the upper substrate 103 may correspond to the substrate 110 as explained in FIG. 1. Therefore, the lower substrate 101 and the upper substrate 103 may include a display area DA and a non-display area NDA.

The light emitting layer LEL may be formed on the inner surface of the lower substrate 101. Especially, the light emitting layer LEL may be disposed on the display area DA of the lower substrate 101. The light emitting layer LEL may include the thin film transistors ST and DT and the organic light emitting diode OLE as explained in FIG. 1. In FIG. 7, these elements are illustrated as the light emitting layer LEL in convenience.

The micro-lens layer NL may be disposed on the inner surface of the upper substrate 103. On the micro-lens layer NL, the black matrix BM and the color filter CF may be formed. The micro-lens layer NL may be disposed on the display area DA and the non-display area NDA of the upper substrate 103. On the contrary, the color filter CF and the black matrix BM are disposed at the display area DA only on the micro-lens layer NL. The color filter CF may be disposed as corresponding to the organic light emitting diode OLE. The black matrix BM may be disposed as corresponding to the thin film transistors ST and DT.

The lower substrate 101 and the upper substrate 103 may be joined each other with a uniform gap having a dam 105 there-between. Further, between the lower substrate 101 and the upper substrate 103, the filling layer FL may be disposed to maintain the uniform gap. In this third embodiment, the dam 105 may directly contact to inner surface of the micro-lens layer NL at the non-display area NDA, and the inner surface of the non-display area NDA of the lower substrate 101. In this case, it is preferable that the micro lens pattern is formed at the display area DA of the micro-lens layer NL, but there is no micro lens pattern at the non-display area NDA.

For example, the micro-lens layer NL may include a pattern portion LP and an encapsulation portion EN. The pattern portion LP is the portion having the micro lens pattern, so it may contact the color filter CF or the black matrix BM. That is, the pattern portion LP is the portion corresponding to the display area DA of the micro-lens layer NL. The encapsulation portion EN is expanding to the outside from the pattern portion LP, covering the upper surface and outer side surface of the dam 105, covering the side surface of the lower substrate 101 and covering the circumferences of the outer bottom surface of the lower substrate 101. That is, the encapsulation portion EN may be disposed at the non-display area of the upper substrate 103 and the lower substrate 101.

The dam 105 may be disposed at the non-display area NDA of the micro-lens layer NL as surrounding the light emitting layer LEL formed at the display area DA. The filling layer FL may fill the space surrounded by the dam 105 and cover the light emitting layer LEL. Further, micro-lens layer NL may be expanding as covering all of outer vertical wall surface of the dam 105, covering side surface of the lower substrate 101, and covering the non-display area NDA at the outer bottom surface of the lower substrate 101. In that case, the micro-lens layer NL may be attached to the outer surface of the dam 105, the side surface of the lower substrate 101 and the outer bottom surface of the lower substrate 101, by an adhesive layer AH.

With the structure according to the third embodiment, the micro-lens layer NL may surround the outer portions of all display elements formed at the lower substrate 101. Accordingly, it is suitable for blocking the penetration of the foreign material such as moisture or gas from the outside. In particularly, as comparing with the first embodiment or the second embodiment, since the adhesive interfaces between the upper substrate 103 and the dam 105 and between the lower substrate 101 and the dam 105 are not exposed to the outside environment but are surrounded by the micro-lens layer NL, the foreign material more effectively and completely prevents from being penetrating into the display elements.

The micro-lens layer NL may be formed of a transparent resin material. For example, the micro-lens layer NL may include a transparent resin material having a refractive index in a range of 1.4~1.7. In detail, the micro-lens layer NL may be formed by depositing a transparent resin material such as the colorless polyimide (CPI) and the poly aluminium chloride (PAC), hardening and patterning it to form a plurality of convex lens patterns arrayed as a plan sheet. The micro-lens layer NL may have a thickness in a range of 25 μm~50 μm.

The color filter CF may include a red color filter CFR, a green color filter CFG and a blue color filter CFB. The red color filter CFR, the green color filter CFG and the blue color filter CFB are alternately disposed each other in a direction on a plan surface. A unit pixel may be configured with the red color filter CFR, the green color filter CFG and the blue color filter CFB.

The micro-lens layer NL according to the third embodiment may have the size of the lens pattern and the pitch of lens array as mentioned in the first embodiment. For example, the width (or diameter) of lens may be any one in a range of 430 nm to 490 nm. The arrayed interval (or pitch) of the micro-lens pattern may be any one in a range of 410 nm to 510 nm. For this case of micro-lens pattern, only the path of the light in the blue wavelength band (460±50 nm) may be changed into perpendicular direction to the plan surface of the micro-lens layer NL.

Otherwise, the micro-lens layer NL may have the lens pattern size and array pitch the same as the second embodiment. For example, the micro-lens layer NL of the third embodiment may include a first micro-lens pattern NL1, a second micro lens pattern NL2 and a third micro lens pattern NL3. For example, the first micro lens pattern NL1 corresponding to the red color filter CFR may have a lens width (or diameter) in a range of 600 nm to 660 nm. The arrayed interval (or pitch) of the first micro lens pattern NL1 may be any one in a range of 580 nm to 680 nm. The second micro lens pattern NL2 corresponding to the green color filter CFG may have a lens width (or diameter) in a range of 500 nm to 560 nm. The arrayed interval (or pitch) of the second micro lens pattern NL3 may be any one in a range of 480 nm to 580 nm. Further, the third micro lens pattern NL3 corresponding to the blue color filter CFB may have a lens width (or diameter) in a range of 430 nm to 490 nm. The arrayed interval (or pitch) of the third micro lens pattern NL3 may be any one in a range of 410 nm to 510 nm.

In the third embodiment, as in the first embodiment and the second embodiment, the micro lens layer NL may be disposed between the color filter CF and the upper substrate 103. Accordingly, since the distance between the organic light emitting diode OLE and the color filter CF is narrower as the thickness of the micro lens layer NL, so that the optical property such as a viewing angle may not be degraded or be improved.

It will be apparent to those skilled in the art that various modifications and variations can be made in the electroluminescence display of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescence display, comprising:
    a lower substrate having a light emitting layer at middle portions;
    an upper substrate facing the lower substrate;
    a dam disposed at circumferences of the lower substrate and surrounding the light emitting layer;
    a filling layer filling space surrounded by the dam and covering the light emitting layer;
    a micro-lens layer disposed on an inner surface of the upper substrate, the micro-lens layer having a plurality of lens patterns;
    a color filter disposed as corresponding to the light emitting layer under the micro-lens layer; and
    a black matrix disposed at a side of the color filters under the micro-lens layer,
    wherein the one lens pattern includes:
    a width of any one in range according to a light wavelength band of the color filter; and
    a pitch of any one in range according to the light wavelength band of the color filter.

2. The electroluminescence display according to claim 1, wherein the color filter includes a plurality of color filters having different color, respectively.

3. The electroluminescence display according to claim 2, wherein the micro-lens layer includes:
    a first micro lens pattern corresponding to a first color filter;
    a second micro lens pattern corresponding to a second color filter; and
    a third micro lens pattern corresponding to a third color filter.

4. The electroluminescence display according to claim 3, wherein the first color filter passes a light in a wavelength of 630 nm,
    wherein a width of the first micro lens pattern is any one in rage of 600 nm to 660 nm, and
    wherein a pitch of the first micro lens pattern is any one in range of 580 nm to 680 nm.

5. The electroluminescence display according to claim 3, wherein the second color filter passes a light in a wavelength of 530 nm,
    wherein a width of the second micro lens pattern is any one in rage of 500 nm to 560 nm, and
    wherein a pitch of the second micro lens pattern is any one in range of 480 nm to 580 nm.

6. The electroluminescence display according to claim 3, wherein the third color filter passes a light in a wavelength of 460 nm,
    wherein a width of the third micro lens pattern is any one in rage of 430 nm to 490 nm, and
    wherein a pitch of the third micro lens pattern is any one in range of 410 nm to 510 nm.

7. The electroluminescence display according to claim 1, wherein the micro-lens layer has a thickness in range of 25 μm to 50 μm.

8. The electroluminescence display according to claim 1, wherein the micro-lens layer has a refractive index in range of 1.4 to 1.7.

9. The electroluminescence display according to claim 1, wherein the dam attaches the upper substrate and the lower substrate by adhering inner circumference surfaces of the upper substrate and the lower substrate.

10. The electroluminescence display according to claim 1, wherein the micro-lens layer includes:
   a pattern portion contacting the color filter and the black matrix and having a plurality of lens patterns; and
   an encapsulation portion expanding from the pattern portion to the outside, covering an upper surface and an outer side surface of the dam, covering a side surface of the lower substrate and covering an outer bottom surface of the lower substrate.

11. The electroluminescence display according to claim 10, further including:
   an adhesive layer disposed between an encapsulating layer and the outer side surface of the dam, between the encapsulation layer and the side surface of the lower substrate, and between the encapsulating layer and the outer bottom surface of the lower substrate.

12. The electroluminescence display according to claim 10, wherein the micro-lens layer has a plurality of micro lens pattern within areas surrounded by the dam.

\* \* \* \* \*